United States Patent [19]

Borg

[11] Patent Number: 4,818,238

[45] Date of Patent: Apr. 4, 1989

[54] TEST SOCKET FOR LEADLESS CHIP CARRIER

[75] Inventor: Wade P. Borg, El Segundo, Calif.

[73] Assignee: Hughes Aircraft Company, Los Angeles, Calif.

[21] Appl. No.: 799,886

[22] Filed: Nov. 20, 1985

[51] Int. Cl.[4] .............................................. H05K 13/08
[52] U.S. Cl. .......................................... 439/42; 439/71
[58] Field of Search .......... 339/17 CF, 17 M, 17 LM, 339/117 P, 75 M, 75 P; 324/158 F; 439/71, 72, 375, 42

[56] References Cited

U.S. PATENT DOCUMENTS

| | | | |
|---|---|---|---|
| 3,904,262 | 9/1975 | Cutchaw | 339/17 CF |
| 3,993,384 | 11/1976 | Dennis et al. | 439/71 |
| 4,194,800 | 3/1980 | Chow | 339/17 CF |
| 4,209,745 | 6/1980 | Hines | 339/117 P |
| 4,229,492 | 10/1980 | Deo et al. | 339/17 CF |
| 4,506,938 | 3/1985 | Madden | 339/17 CF |

FOREIGN PATENT DOCUMENTS 2604787 8/1976 Fed. Rep. of Germany ........ 439/71

OTHER PUBLICATIONS

Buchoff, L. S., "Metal Elastomer Display Connectors" from SID International Symposium Digest of Technical Papers, Chicago, Ill., May 7-11, 1979, pp. 64, 65.

Primary Examiner—Daniel C. Crane
Attorney, Agent, or Firm—Leonard A. Alkov; A. W. Karambelas

[57] ABSTRACT

A test socket (10) for a leadless chip carrier (13) having a rigid guide frame (21) for holding a resilient connector member (23), and for assuring correct alignment of the chip carrier (13). The assembly is mounted on a printed wiring board (22), and the resilient connector member (23) has a pattern of conductive strips (31) that make contact to the chip carrier (13) at the top, and make contact to the printed wiring board (22) at the bottom. A vacuum is selectively applied to a hole (35) in the printed wiring board (22) to seal the chip carrier (13) against the resilient connector member (23).

1 Claim, 2 Drawing Sheets

TEST SOCKET FOR LEADLESS CHIP CARRIER

BACKGROUND

This invention relates to a zero insertion force test socket for leadless chip carriers and, more particularly, to a test socket that permits the automatic insertion and removal of leadless chip carriers for electrical test and vertification.

Leadless chip carriers are very tiny components having a pattern of minute connection terminals thereon, as well as having minute identification markings thereon. Due to this miniature nature of the component, errors have been made frequently in installing them into the apparatus in which they are used. Sometimes the wrong component is installed; somtimes the component is oriented incorrectly; and sometimes the component is electrically imperfect as to its characteristics or operation. Rework and replacement is costly and time-consuming, and should be reduced or eliminated.

Accordingly, it was deemed desirable to test and verify the leadless chip carriers prior to their being soldered into the apparatus. It was considered desirable to be able to automatically insert and remove the leadless chip carriers into a holder or test socket at a station along the assembly line just prior to the soldering operation for testing and verification.

The only available sockets require either considerable force to insert or remove the leadless chip carrier due to the resistance created by side-wiping spring contacts, or a mechanical holding or clamping device.

In the past, there were no sockets in which leadless chip carriers could be automatically loaded and unloaded. The closest socket to the test socket 10 of the present invention is the LOCKNEST socket made by Plastronics, Inc. (not shown). The LOCKNEST socket is loaded by pressing down on the top of the socket, which retracts mechanical contacts. After the leadless chip carrier is inserted, pressure is released from the socket and the mechanical contacts "lock onto" the leadless chip carrier. To unload the socket, pressure is again applied to the top of the socket, and a blunt instrument is used to push the leadless chip carrier out from the bottom.

SUMMARY

In order to aid in the understanding of this invention, it can be stated in essentially summary form that it is directed to a leadless chip carrier socket having a rigid guide frame which holds a resilient connector member. The frame assures correct alignment of the chip carrier with the resilient connector member. The elastomeric connector member provides a vacuum seal, and provides firm electrical contact when a vacuum is applied to the socket to "pull" the chip carrier down therein.

It is, thus, a purpose and advantage of this invention to provide a connector for leadless chip carriers which requires essentially zero insertion force.

It is a further purpose and advantage of this invention to provide a leadless chip carrier test socket in which the leadless chip carriers can be inserted and removed automatically.

It is a another purpose and advantage of the present invention to provide a socket that will allow leadless chip carriers to be tested and verified without being mechanically held or clamped.

Other purposes and advantages of this invention will become apparent from a study of the following portion of the specification, the claims and the attached drawings.

DESCRIPTION OF THE PREFERRED EMBODIMENT

Figure 1:
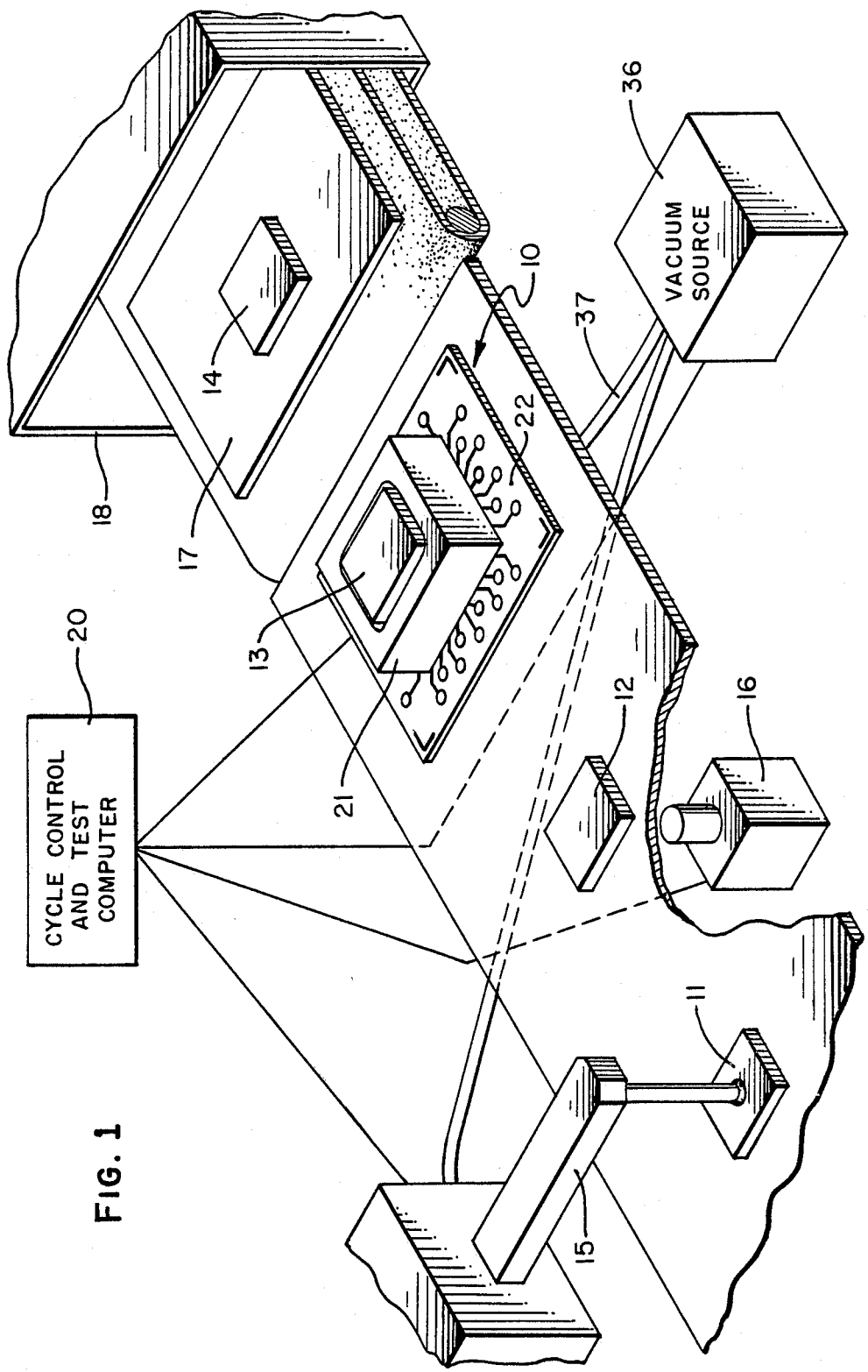
FIG. 1 is a perspective view of an assembly line showing leadless chip carriers being tested and verified in a test socket of the present invention prior to being soldered onto a printed circuit board.

Referring now to the drawings, FIG. 1 illustrates an assembly line employing a test socket 10 embodying features of the present invention. Four leadless chip carriers 11, 12, 13, 14 are shown at four stations along the assembly line. The first station on the left is a vacuum pickup 15, and it has fed to it leadless chip carrier 11 from a magazine feeder (not shown).

Station two of the assembly line is an optical reader 16 which identifies the electrical contacts on the leadless chip carrier 12, which both identify the chip carrier, and define its orientation. After the chip carrier 12 is identified as being the correct component in the correct orientation by the optical reader 16 at station two, the vacuum pickup 15 takes it to station three. Here, the leadless chip carier 13 is placed in the test socket 10 of the present invention for electrical test and verification.

After passing the electrical test at station three, the leadless chip carrier 14 is placed on a printed circuit board 17 at station four where it is soldered in place by a reflow soldering system 18.

It should be apparent that the testing of the electrical operation, and the verifying of the component identity and orientation prior to soldering the chip carrier 14 onto the printed circuit board 17 prevents or eliminates costly errors and rework. From station four, the printed circuit board 17 with the leadless chip carrier 14 mounted on it, moves on down the assembly line for other operations, as desired.

It is to be clearly understood that details of the assembly line, such as the construction and operation of the vacuum pickup 15, optical reader 16 and reflow soldering head 18, are well known. It should also be understood that the assembly line is controlled by a cycle control and test computer 20 that is connected to each station thereof, as is well-known in the art.

Clearly, the test socket 10 of the present invention is not limited to use in the assembly line illustrated in FIG. 1. This test socket 10 has potential use in any environment in which leadless chip carriers are produced, or are installed in a product. Furthermore, as the use of automated equipment for assembly, testing and verifying increases, the need for the test socket 10 of the present invention that can be automatically loaded and unload will also increase.

It is desired that the test socket 10 be adapted to be automatically loaded and unloaded To that end, the test socket 10 is made in such a way that a leadless chip carrier may be inserted therein while applying zero insertion force That is to say, the need to apply a force to overcome the resistance created by side-wiping spring contacts has been eliminated.

Furthermore, no mechanical holding devices are employed in the test socket 10 of the present invention. That is to say, good electrical contact is made to the leadless chip carrier without employing a mechanical clamp to provide the necessary contact force.

Figure 2:
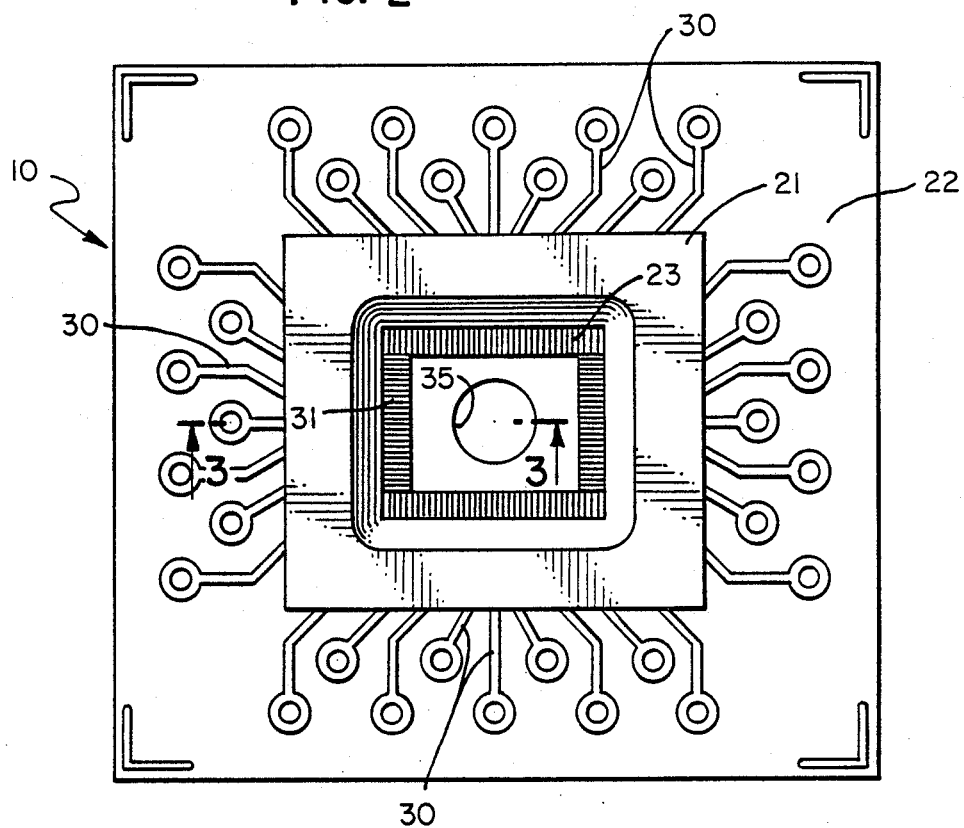
FIG. 2 is an enlarged plan view of a leadless chip carrier test socket- constructed in accordance with the invention.
Figure 3:
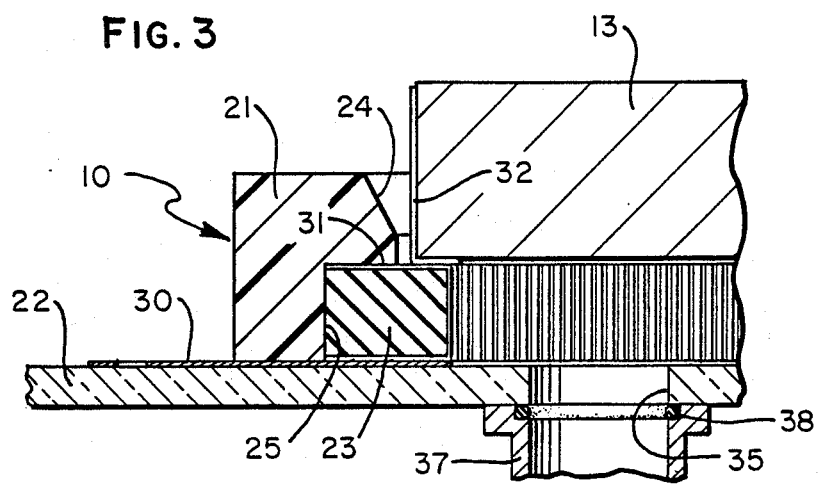
FIG. 3 is an enlarged sectional view thereof, taken along the line 3—3 of FIG. 2, with parts broken away, showing a leadless chip carrier in the test socket of the present invention.

Referring now to FIG. 2 of the drawings, there is shown a plan view of a test socket 10 constructed in accordance with a preferred embodiment of the invention. FIG. 3 is an enlarged sectional view, taken along the line 3—3 of FIG. 2, with parts broken away, showing a leadless chip carrier 13 inserted in the test socket 10.

Because the leadless chip carrier 13 is a very small electrical component, the drawings have been greatly enlarged to better show the details of how the test socket 10 of the present invention electrically interconnects therewith.

The test socket 10 is comprised of a rigid guide frame 21, disposed on a printed wiring board 22, and having a resilient connector member 23 contained therewithin. The guide frame 21 serves as a housing for the test socket 10, and is made of a rigid material, such as rigid plastic, for example. The rigid guide frame 21 is of the same general shape as the leadless chip carrier, either square or rectangular, and is provided with interior sloped sides, as at 24. This assures correct alignment of the leadless chip carrier 13 as it is placed within the guide frame 21 of the test socket 10 while being guided to the bottom thereof by the sloped sides 24.

At the bottom of the guide frame 21 is a recess 25 in which the square or rectangular resilient connector member 23 is held by a slight force fit. The connector member 23 is made of an elastomeric substance such as a synthetic rubber, or an elastic rubberlike substance, such as a plastic having some of the physical properties of natural rubber This material or substance is, of course, an electrical insulator material The guide frame 21 is rigidly bonded to the printed wiring board 22 by a suitable dielectric adhesive, while the resilient connector member 23 is removable should it be necessary to replace it due to wear or damage.

The printed wiring board 22 has a pattern of electrical conductors 30 on the surface thereof, which match the electrical connections of the leadless chip carrier to be tested. The resilient connector member 23 is provided with a matching pattern of conductive strips 31 applied in a U-shaped configuration along the top of the connector member 23, down the side, and along the bottom of the connector member 23. The leadless chip carrier 13 has a pattern of connection terminals 32 that extend down the side thereof and wrap under the edge of the chip carrier 13.

Thus, it will be seen that the U-shaped conductive strips 31 on the resilient connector member 23 make contact at the top with the connection terminals 32 of the leadless chip carrier 13, and make contact at the bottom with the conductors 30 on the printed wiring board 22. In that manner, the resilient connector member 23 serves to interconnect the leadless chip carrier 13 with the electrical conductors 30 on the printed wiring board 22.

There is a small hole 35, which may be approximately 0.20" in diameter, through the printed wiring board 22 in the center of the test socket 10. The hole 35 is connected to a vacuum source 36 by a suitable piece of tubing 37. The tubing 37 may be provided with an O-ring 38 to seal it to the bottom of the printed wiring board 22.

When the leadless chip carrier 13 is placed in the test socket 10, it forms a seal with the resilient connector member 23. The leadless chip carrier 13 is pulled down by the vacuum. This compresses the resilient connector member 23 around the connection terminals 32 of the chip carrier 13. This deflection of the elastomeric connector member 23 provides a good vacuum seal and also a good, reliable electrical connection, even if the connection terminals 32 are uneven in thickness due to solder deposited thereon for the later reflow solder operation. Upon removal of the vacuum, the chip carrier is free to be lifted out, without contact friction.

The zero insertion force test socket 10 allows the leadless chip carrier 13 to be automatically loaded and unloaded on the assembly line shown in FIG. 1, thus allowing the chip carrier 13 to be tested and verified without mechanical clamping. The socket is able to do this because of the provision of the following features: the rigid guide frame 21 which holds the resilient connector member 23 in place and assures correct alignment of the leadless chip carrier 13; the elastomeric resilient connector member 23 that provides electrical contact and also a vacuum seal between the chip carrier 13 and the printed wiring board 22; and the use of a vacuum which "pulls" the chip carrier 13 down, causing deflection in the resilient connector member 23, and in turn creating an electrical path from the chip carrier 13 to the printed wiring board 22.

Once the leadless chip carrier 13 is electrically connected to the printed wiring board 22 at station three of the assembly line, it is thoroughly tested and checked electrically. If desired, the cycle control and test computer 20 may be programmed to actually operate the electrical components in the chip in the chip carrier in a circuit in the same way it will be operated after it is installed on the printed circuit board 17, to measure its operating characteristics, as well as to measure its electrical parameters.

At the completion of the electrical test and verification, the vacuum applied to the test socket 10 is interrupted, and the leadless chip carrier 13 is automatically removed from the test socket 10 by the vacuum pickup 15. Of course, once the vacuum is no longer applied to the test socket 10, no force is needed to disengage the electrical contacts and physically remove the leadless chip carrier 13 from the test socket 10.

At station four of the assembly line, the leadless chip carrier 14, having been tested at station three, is positioned on the printed circuit board 17. The connection terminals 32 of the leadless chip carrier 14 are placed directly on the pretinned pads of the circuit board 17. Once all the leadless chip carriers have been placed on the printed wiring board through repeating the previous steps, the populated printed wiring board is passed through a reflow soldering system 18. The reflow soldering system heats the already present solder, usually through the use of an infrared heating element or a hot vapor chamber, causing the solder to reflow. By careful and skillful use of heating techniques, overheating of the leadless chip carrier 14 itself is avoided while assuring a flawless solder connection between the connection terminals 32 of the leadless chip carrier 14 and the pads on the printed circuit board 17.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A socket for an electrical component comprising:
    a substantially rigid frame having an aperture therein with sloped entry sides in said aperture at the entrance of said aperture for receiving and guiding an electrical component into said aperture, a connector recess at the bottom of said aperture, said aperture having sides above said connector recess so that an electrical component can be smoothly inserted and removed into said aperture by guidance by said sloped entry sides toward said connector recess and out of said aperture without catching on the sides of said aperture;
    connector means having a top and having a bottom disposed in said recess in said frame for making connection to the electrical component received in said opening, said connector means being made of an insulating elastomeric material, a pattern of conductor strips disposed on said insulating elastomeric material extending from the top thereof to the bottom thereof, said frame being positioned with respect to said connector means so that an electrical component guided by said aperture in said frame is guided into contact with said conductor strips on said top of said connector means so as to make contact and form a vacuum seal between the electrical component and said connector means;
    means for testing the conductors on said bottom of said resilient dielectric connector to test the electrical component in contact with said top of said connector; and
    vacuum holding means for urging the electrical component toward said connector means.

* * * * *